United States Patent [19]
Roberts

[11] 3,992,760
[45] Nov. 23, 1976

[54] APPARATUS AND PROCESS FOR MEASURING THE RESONANT FREQUENCY AND COEFFICIENT OF COUPLING OF A PLURALITY OF COUPLED PIEZOELECTRIC RESONATORS

[75] Inventor: Gerald E. Roberts, Lynchburg, Va.

[73] Assignee: General Electric Company, Lynchburg, Va.

[22] Filed: Jan. 13, 1976

[21] Appl. No.: 648,791

Related U.S. Application Data

[62] Division of Ser. No. 506,800, Sept. 17, 1974, Pat. No. 3,907,517.

[52] U.S. Cl. .................................. 29/25.35
[51] Int. Cl.² .................. B01J 17/00; H04R 17/00
[58] Field of Search .................... 29/25.35; 73/67.2

[56] References Cited
UNITED STATES PATENTS

| | | | |
|---|---|---|---|
| 3,763,530 | 10/1973 | Helfen | 29/25.35 |
| 3,851,385 | 12/1974 | Meisner | 29/25.35 X |

*Primary Examiner*—Willie G. Abercrombie
*Attorney, Agent, or Firm*—James J. Williams

[57] ABSTRACT

Apparatus is provided for measuring the resonant frequency and the coefficient of coupling of a plurality of coupled piezoelectric resonators. A plurality of electrode terminals are provided in the apparatus for connection to respective resonator electrodes, and a common terminal is provided for connection to common electrodes of the resonators. First switching means are connected to a signal source for applying the signal selectively to one of the electrode terminals. A parallel resonant circuit is coupled between each of the electrode terminals and the common terminal respectively to provide a relatively high impedance at the resonant frequency of the adjacent resonators. Second switching means are connected in parallel with the parallel resonant circuits for selectively short-circuiting the resonant circuits. In operation, the resonant frequency of each of the resonators is indicated by applying a signal of the proper frequency to the apparatus with the resonant circuits not short-circuited, and measuring resonant frequencies in the apparatus. Coupling between adjacent resonators is indicated by applying a range of signal frequencies to the apparatus with selected resonant circuits short-circuited, and measuring resonant frequencies in the apparatus.

1 Claim, 3 Drawing Figures

3,992,760

APPARATUS AND PROCESS FOR MEASURING THE RESONANT FREQUENCY AND COEFFICIENT OF COUPLING OF A PLURALITY OF COUPLED PIEZOELECTRIC RESONATORS

This is a division, of application Ser. No. 506,800, filed Sept. 17, 1974, now U.S. Pat. No. 3,907,517.

BACKGROUND OF THE INVENTION

My invention relates to an electrical measuring apparatus and process, and particularly to such an apparatus and process for measuring the resonant frequency and coefficient of coupling of a plurality of coupled piezoelectric resonators.

Piezoelectric resonators have reached a stage of development where they are used extensively in radio and electronic applications. A typical application uses a plurality of such resonators formed by two or more pairs of electrodes positioned on a single plate of piezoelectric material. This arrangement is sometimes called a monolithic crystal. The mass loading of each pair of electrodes forming a resonator determines in part the resonant frequency of that resonator. Coupling between adjacent resonators is determined in part by the effective separation between adjacent resonators. By positioning a coupling strip between adjacent resonators, their effective separation is reduced and coupling is increased. In the manufacture of such a device, electrode material is deposited on the resonators such that their resonant frequencies are slightly lower than desired. The frequency of each resonator is increased to the desired value by removal of effective electrode mass from each pair of electrodes. Also the coupling strip between resonators is designed such that the effective separation between resonators is smaller than needed, yet such that if the coupling strip were completely removed the effective separation between resonators would produce an effective coupling which would be too small. The coupling strips are reduced in size, thereby increasing the effective spacing between resonators, to decrease the coupling between adjacent resonators to the desired value. Where relatively large quantities of such devices are manufactured, automated techniques using laser trimming apparatus are used to advantage. Such automated techniques need or require an apparatus and a process for measuring the resonant frequency and the coefficient of coupling of a plurality of coupled piezoelectric resonators in order that the resonators can be easily and quickly trimmed to the desired values.

Accordingly, a primary object of my invention is to provide a new and improved apparatus for measuring the resonant frequency and coefficient of coupling of a plurality of coupled piezoelectric resonators.

Another object of my invention is to provide a new and improved process for measuring the resonant frequency and coefficient of coupling of a plurality of coupled piezoelectric resonators.

Another and fairly specific object of my invention is to provide novel apparatus that lends itself to measuring the resonant frequency and coefficient of coupling of a plurality of coupled piezoelectric resonators for use with automated trimming applications.

SUMMARY OF THE INVENTION

Briefly, these and other objects are achieved in accordance with my invention by apparatus comprising a plurality of electrode terminals, each of which is adapted to be connected to a respective electrode of a plurality of coupled piezoelectric resonators. A common terminal is provided and adapted to be connected to the common electrodes of the resonators. A respective parallel resonant circuit, having a selected resonant frequency characteristic, is connected between each of the electrode terminals and the common terminal. The selected resonant frequency characteristics of each parallel resonant circuit is arranged to resonate with its respective resonator and produce a relatively high impedance in the vicinity of the resonant frequency of the adjacent resonator. A multi-contact switch having an input terminal and a plurality of output terminals is provided to connect a signal applied to its input terminal to one of its output terminals. Each of the switch output terminals is respectively connected to an electrode terminal. A plurality of short-circuiting switches is provided, and one of the short-circuiting switches is connected in parallel with selected ones of the parallel resonant circuits, respectively. And means are connected to the apparatus and adapted to be connected to a device for indicating resonant frequencies in response to signals applied to the multi-contact switch input terminal.

In operation, a signal of selected frequency is applied through the multi-contact switch to each respective pair of resonator electrodes while adjacent pairs of resonator electrodes are open-circuited by the parallel resonant circuits. The pair of electrodes receiving the signal can be trimmed to provide a resonator of the desired resonant frequency. A range of variable frequency signals is also applied to each of the pairs of electrodes while adjacent pairs of electrodes are short-circuited. This range of signals will provide two resonant frequencies which indicate the coefficient of coupling. The coupling strips can be trimmed so as to vary the two resonant frequencies until the desired coefficient of coupling is provided.

Thus, the apparatus and process provides a new and improved means to measure the resonant frequency and coefficient of coupling of a piezoelectric device, so as to provide a rapid or automated trimming of the device.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF A PREFERRED EMBODIMENT

Figure 1:
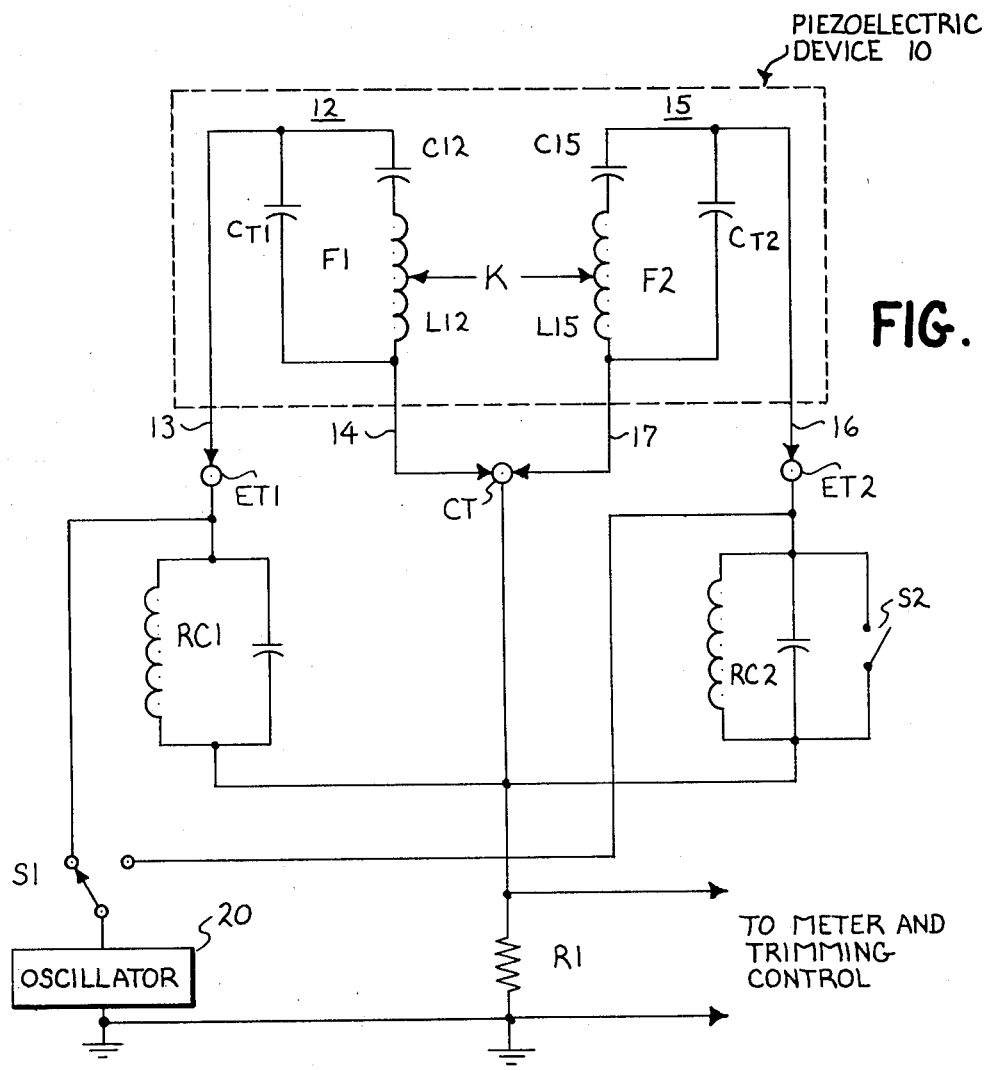
FIG. 1 shows an electrical circuit diagram of apparatus in accordance with my invention for measuring the resonant frequency and the coefficient of coupling of two coupled piezoelectric resonators.
Figure 2:
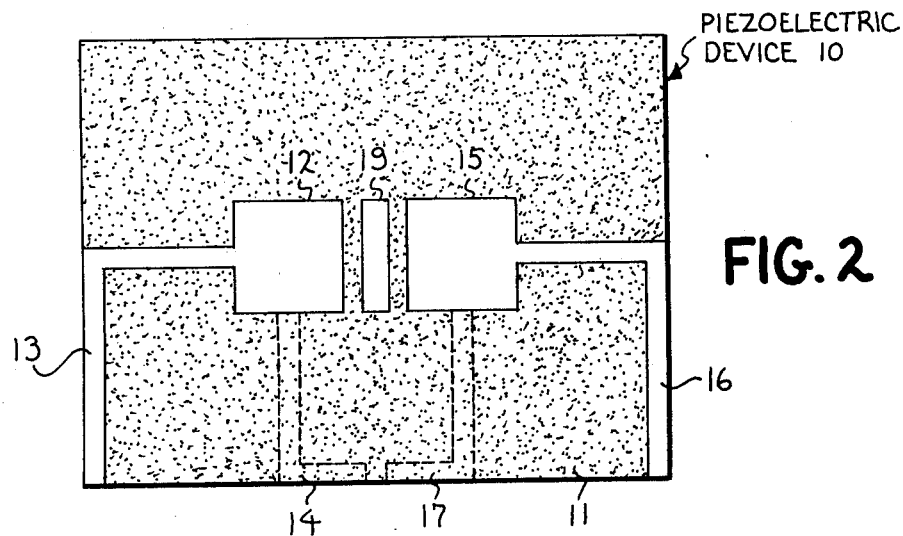
FIG. 2 shows a plan view of a piezoelectric device having two coupled resonators for which the apparatus of FIG. 1 is provided.

My apparatus and process can be better understood if some of the characteristics of a piezoelectric device are explained. FIG. 1 shows one equivalent electrical circuit diagram (enclosed in the dashed line rectangle) of a piezoelectric device (or monolithic crystal) 10, and FIG. 2 shows a plan view of the actual piezoelectric device 10. The device 10 chosen for explanation has two resonators. With reference to FIG. 2, the device 10 is formed of a rectangular plate of piezoelectric material 11. A first pair of electrodes 12 (which are similar and correspondingly positioned) is provided on opposite faces of the material 11, and an electrical connection for the upper one of the electrodes 12 is provided by a lead 13 and an electrical connection for the lower one of the electrodes 12 is provided by a lead 14. A second pair of electrodes 15 (which are similar and correspondingly positioned) is also provided on opposite faces of the material 11, and upper and lower leads 16, 17 are provided to these electrodes 15. Alternating current signals applied to the leads 13, 14 cause the material 11 between the electrodes 12 to mechanically vibrate, and thus form an electrical resonator. These vibrations cause voltages to be introduced between the electrodes 15, and these voltages can be derived at the leads 16, 17. As is known, the piezoelectric material 11 has resonant properties such that only a narrow band of signals is passed between the input leads 13, 14 and the output leads 16, 17. The resonant frequency of each resonator is determined in part by the mass loading of the material comprising the electrodes, and the shape of the pass band is determined in part by the number of resonators. The degree of coupling between the resonator formed by the electrodes 12 and the resonator formed by the electrodes 15 varies as an inverse function of the effective separation between the electrodes 12, 15. This effective separation can be increased (to decrease the coefficient of coupling) by reducing the area of a coupling strip 19 which is typically positioned on only one side of the material 11.

The equivalent electrical circuit of the device 10 has two parts 12, 15 corresponding to the resonators between the electrodes 12, 15 in FIG. 2. The part 12 comprises a terminal and static capacitor $C_{T1}$. The capacitor $C_{T1}$ has a substantially fixed value for a given resonator. The motional or piezoelectric part 12 of the device 10 is represented by a motional capacitor C12 connected in series with a motional inductance L12. This circuit is connected to the leads 13, 14. The electrical circuit for the part 15 is similar and comprises a terminal capacitor $C_{T2}$, and a series capacitor C15 and series inductor L15. This circuit is connected to the leads 16, 17. Coupling between the two resonators is represented by a coefficient of coupling K between the inductors L12, L15. The magnitude of this coefficient of coupling K is determined in part by the effective spacing between the electrodes 12, 15, the nature and thickness of the piezoelectric material 11, and the size and geometry of the coupling strip 19 if provided.

The center frequency characteristic of the device 10 is determined in part by the mass loading of the electrodes 12, 15 forming the resonators, and the bandpass characteristic of the device 10 is determined in part by the effective separation (and hence coupling) provided by the coupling strip 19. The resonators between the elctrodes 12, 15 may be tuned to the same frequency or may be tuned to slightly different frequencies, depending upon the bandpass desired. The resonators are tuned by applying a signal of the desired frequency to each pair of resonator electrodes and decreasing the mass loading of the electrodes to raise the resonator frequency to match that of the applied signal. However, in order to provide an accurate indication of resonance, it is desirable that the other resonator appear as an open circuit. In accordance with my invention, I provide apparatus for achieving this. My apparatus includes a first parallel resonant circuit RC1 connected between a first electrode terminal ET1 and a common terminal CT, and a second parallel resonant circuit RC2 connected between a second electrode terminal ET2 and the common terminal CT. A short-circuiting switch S2 is also provided in parallel with the circuit RC2 for reasons which will be explained. The parallel resonant circuit RC1 is selected so that when the terminal capacitor $C_{T1}$ of its associated resonator is taken into consideration, parallel resonance or very high impedance is provided to the frequency F2 to which the resonator associated with the electrodes 15 is tuned. Similarly, the parallel resonant circuit RC2 is selected so that when the terminal capacitor $C_{T2}$ of its associated resonator is taken into consideration, parallel resonance or very high impedance is provided to the frequency F1 to which the resonator associated with the electrodes 12 is tuned. Signals for my circuit may be provided by an oscillator 20 which has one of its output terminals connected to a signal input terminal of a multicontact switch S1. (The other output terminal of the oscillator may be connected to any suitable reference potential, such as ground.) The contacts of the switch S1 serve as output terminals, one of which is connected to the first electrode terminal ET1, and the other of which is connected to the second electrode terminal ET2. The common terminal CT is connected through a suitable device, such as a resistor R1 for producing a voltage with respect to the reference potential or ground. The other end of the resistor R1 is connected to the other output terminal of the oscillator. An indicating output may be taken across the resistor R1 or some other location in the apparatus. This indicating output is a voltage whose amplitude and phase (with reference to the oscillator voltage) can be indicated by a suitable meter or control device for operating a trimming machine, such as a laser trimmer.

In explaining the operation of my apparatus, I have assumed that the resonator associated with the electrodes 12 of the device 10 is to be tuned to a resonant frequency F1, and the resonator associated with the electrodes 15 of the device 10 is to be tuned to a resonant frequency F2. The device 10 is connected to my apparatus with the lead 13 connected to the first electrode terminal ET1, the leads 14, 17 connected to the common terminal CT, and the lead 16 connected to the second electrode terminal ET2. The oscillator 20 is adjusted to produce the frequency F1, and the input terminal of the switch S1 is connected to the first electrode terminal ET1. The switch S2 is open. In this circuit, the oscillator signal develops a voltage across the resistor R1. The resonant circuit RC2 with its associated capacitor $C_{T2}$ presents a fairly high or maximum impedance to the frequency F1. The electrodes 12 are trimmed to raise the resonant frequency of the resonator associated with them. When this resonator is tuned to the frequency F1, it will cause the voltage across the resistor R1 to be a maximum or nearly a maximum, as best indicated by a zero phase relation with respect to the oscillator voltage. This can be indicated on a meter if an operator is doing the trimming, or can be used to stop trimming with the automated equipment. Then, the oscillator frequency is shifted to the frequency F2 and the switch S1 positioned to supply this frequency F2 to the second electrode terminal ET2. The resonant circuit RC1 and its associated capacitor $C_{T1}$ present a maximum impedance to this frequency F2. The electrodes 15 are trimmed until the output voltage across the resistor R1 is at a maximum or nearly a maximum, as indicated by a zero phase relation with respect to the oscillator voltage. This condition indicates that this resonator is tuned to the desired frequency F2. It is to be understood, of course, that the resonant frequencies of both resonators can be the same as well as different value.

After the resonant frequencies of the resonators are adjusted, the coefficient of coupling K can be adjusted by trimming the coupling strip 19. The oscillator 20 is again connected to the first electrode terminal ET1, and the switch S2 is closed to short-circuit the resonator associated with the electrodes 15. The frequency of the oscillator 20 is then swept over a range of frequencies, and two peak or maximum voltages (best indicated by the zero phase relation with the oscillator voltage) will be produced across the resistor R1 in this range. If these frequencies at which the voltage peaks occur are respectively designated $F_{P1}$ and $F_{P2}$, then the coefficient of coupling is determined by the following expression:

$$K \cong \frac{2(F_{P1} - F_{P2})}{F_{P1} + F_{P2}}.$$

In this expression, $F_{P1}$ is the higher of the two peak frequencies. If the desired coefficient of coupling K is known, then calculations, such as by a computer, can be made to determine the two peak frequencies for this desired coefficient of coupling K. This information can be used by an operator to trim the coupling strip 19 until the desired peak frequencies are reached, or can be used in automated trimming apparatus to provide the trimming.

Figure 3:
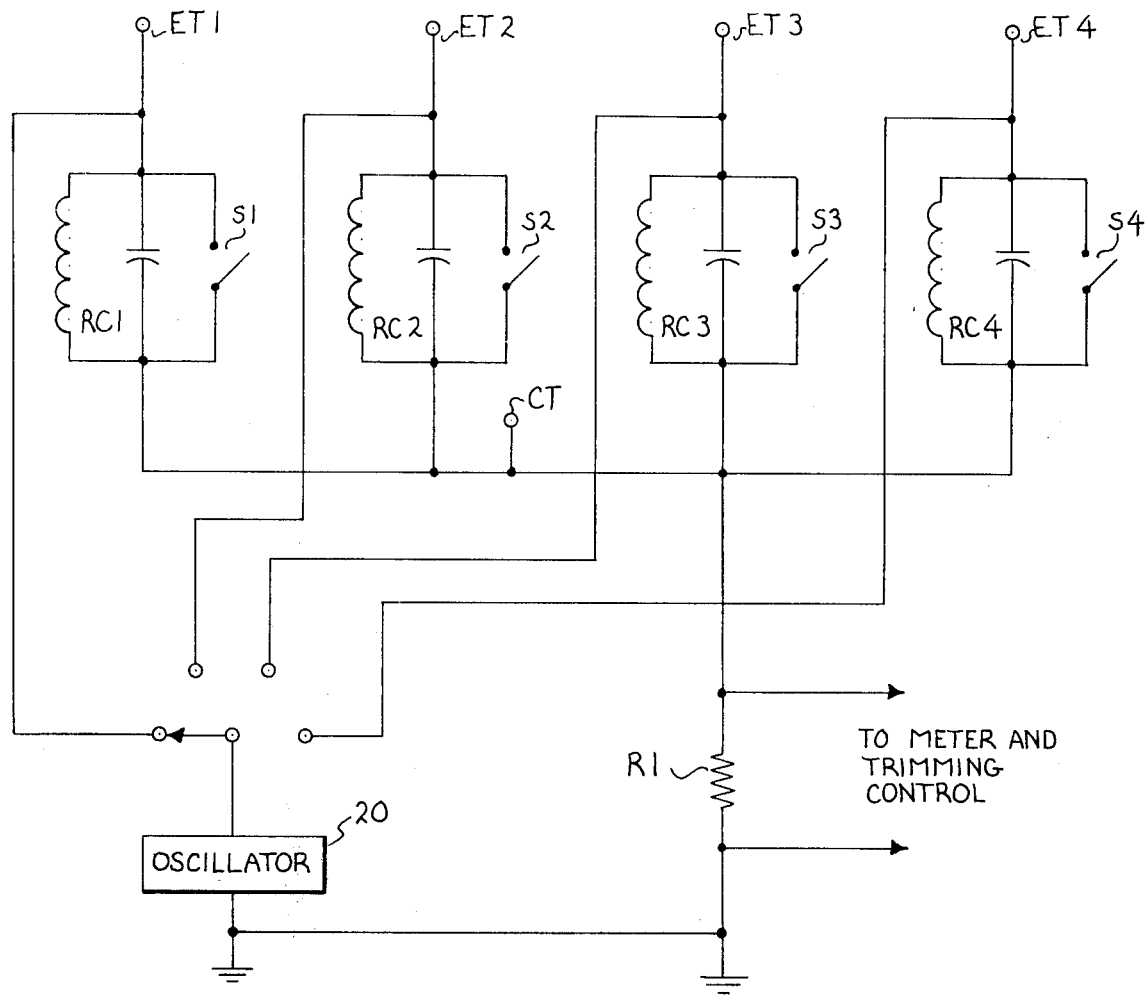
FIG. 3 shows an electrical circuit diagram of apparatus in accordance with my invention for measuring the resonant frequency and coefficient of coupling of a piezoelectric device having more than two coupled resonators.

It will thus be seen that I provide a new and improved apparatus and process for trimming piezoelectric resonators in order to easily, quickly, and automatically adjust the resonant frequency of the resonators and the coefficient of coupling between the resonators. While the explanation above refers to only a two-resonator structure, persons skilled in the art will appreciate that apparatus can be used with a piezoelectric device having a plurality of resonators. For example, in FIG. 3 I show apparatus in accordance with my invention for use with a piezoelectric device having four resonators. In a manner similar to that described in connection with FIG. 1, I provide four electrode input terminals ET1, ET2, ET3, ET4, and a common terminal CT. Parallel resonant circuits RC1, RC2, RC3, RC4 are respectively coupled between one of the electrode terminals and the common terminal. Since these resonant circuits may have to provide a relatively high impedance to more than one frequency, they can be arranged so that they provide a fairly high impedance over a fairly wide range of frequencies. An oscillator 20 is connected to the input terminal of a multi-contact switch which can selectively apply the oscillator output to one of the four electrode terminals ET1, ET2, ET3, ET4. The common terminal CT is connected through the voltage measuring resistor R1 to the oscillator 20 as described previously. Short-circuiting switches S1, S2, S3, S4 are connected in parallel with the parallel resonant circuits RC1, RC2, RC3, RC4, respectively. However, as will be explained, some of the short-circuiting switches may be omitted or not used.

When this apparatus is used, a four resonator piezoelectric device is connected with one electrode of each of the four pairs connected to the electrode terminals ET1, ET2, ET3, ET4 respectively, and with the other electrode of each of the four pairs connected to the common terminal CT. When the resonators are to be adjusted, the switches S1, S2, S3, S4 are open. A frequency F1 is applied to the electrode terminal ET1, and the other resonant circuits RC2, RC3, RC4 produce a relatively high impedance. The first resonator electrodes are trimmed until the desired peak voltage (and zero phase relation) is produced. Then, the frequency F2 is applied to the second electrode terminal ET2 and the second resonator electrodes are trimmed. The resonant circuits RC1, RC3, RC4 produce a relatively high impedance at this frequency F2. In a similar manner, the electrodes for the third and fourth resonators are trimmed. The coefficients of coupling K are then adjusted by first applying a range of frequencies to the first electrode terminal ET1 while the switch S1 is open, the switch S2 is closed, and the swtiches S3, S4 are open. Two peak frequencies are produced, and the coupling strip between the first and second resonators is trimmed. Then, the switch S2 is opened, the switches S1, S4 are left open, the switch S3 is closed, and the range of frequencies applied to the second electrode terminal ET2. This causes two peaks to be produced, and the coupling strip between the second and third resonators is trimmed. Next, the switch S3 is opened, the switches S1, S2 are left open, the switch S4 is closed, and the range of frequencies applied to the third electrode terminal ET3. This causes two peaks to be produced, and the coupling strip between the third and fourth resonators is trimmed. After this third coupling strip it trimmed, it may then be necessary to go back and repeat the procedure just described one or more times in case subsequent strip trimmings have affected previous strip trimmings. As a final check, signals can be applied to the first electrode terminal ET1 with the switch S1 open and the switches S2, S3, S4 closed. This will produce peaks of voltage at four frequencies, and final trimming of the coupling strips can be made to insure that the peaks are at the proper frequencies. However, persons skilled in the art will recognize that the coupling strips can be trimmed with signals applied to various terminals and with the short-circuiting switches S1, S2, S3, S4 in varying conditions. Generally, it can be stated that coupling can be adjusted with the signal applied to one terminal, and with the resonant circuit or circuits toward which coupling is to be adjusted short-circuited. But in any case, my apparatus can be used to adjust the coefficient of coupling between a plurality of coupled resonators of a piezoelectric device.

It will thus be seen that I have provided a new and improved apparatus and process for adjusting the resonant frequency and coefficient of coupling of a multi-resonator piezoelectric device. While I have shown only one embodiment, persons skilled in the art will appreciate the modifications may be made. For example, the resonant circuits may have adjustable elements. The various switches may take any desired mechanical or electrical form. The resonant frequencies may be measured or indicated by the voltages between the electrode terminals, these voltages being a minimum (with zero phase shift relative to the oscillator voltage) at resonance. And with particular respect to the circuit of FIG. 3, short-circuiting switches may be provided in parallel with one or more of the resonant circuits RC1, RC2, RC3, RC4, depending on the coupling procedure to be used. Therefore, while my invention has been described with reference to a particular embodiment, it is to be understood that modifications may be made without departing from the spirit of the invention or from the scope of the claims.

What I claim as new and desire to secure by letters patent of the United States is:

1. A process for adjusting the resonant frequency and coefficient of coupling a plurality of pairs of resonator electrodes mounted on opposite sides of a plate of piezoelectric material to form a plurality of coupled resonators, and a coupling strip positioned on one side of said plate between adjacent ones of said resonator electrodes, said process comprising the steps of:

a. applying a signal of a selected frequency to each of said pairs of electrodes while adjacent pairs of said electrodes are open-circuited;

b. trimming each of said pairs of electrodes to cause each of said resonators to resonate to its respective selected frequency while said adjacent pairs of electrodes are open-circuited;

c. applying a range of variable frequency signals to at least one of said pairs of electrodes while at least one other pair of said electrodes is short-circuited;

d. and trimming each of said coupling strips to provide two resonant conditions at two selected frequencies in said range of frequencies while said other pair of electrodes is short-circuited.

* * * * *

UNITED STATES PATENT OFFICE
CERTIFICATE OF CORRECTION

Patent No. 3,992,760     Dated November 23, 1976

Inventor(s) Gerald E. Roberts

It is certified that error appears in the above-identified patent and that said Letters Patent are hereby corrected as shown below:

Title page, line marked [62], cancel "3,907,517" and insert -- 3,963,982 --

Column 1, line 7, cancel "3,907,517" and insert -- 3,963,982 --

Column 6, line 37, cancel "it", first occurrence, and insert -- is --.

Signed and Sealed this

Twenty-ninth Day of November 1977

[SEAL]

Attest:

RUTH C. MASON
*Attesting Officer*

LUTRELLE F. PARKER
*Acting Commissioner of Patents and Trademarks*